United States Patent
Chen

(10) Patent No.: US 7,075,289 B2
(45) Date of Patent: Jul. 11, 2006

(54) WIRELESS REMOTE CONTROL MEASURING MULTIPURPOSE METER

(75) Inventor: Chieh-Te Chen, Yung Ho (TW)

(73) Assignee: DER EE Electrical Instrument Co., Ltd., Taipei Hsien (TW)

( * ) Notice: Subject to any disclaimer, the term of this patent is extended or adjusted under 35 U.S.C. 154(b) by 0 days.

(21) Appl. No.: 10/898,944

(22) Filed: Jul. 27, 2004

(65) Prior Publication Data

US 2006/0022663 A1    Feb. 2, 2006

(51) Int. Cl.
*G01R 11/32*    (2006.01)

(52) U.S. Cl. ..................................... 324/142

(58) Field of Classification Search ................. 324/142
See application file for complete search history.

(56) References Cited

U.S. PATENT DOCUMENTS

| | | | | |
|---|---|---|---|---|
| 4,317,130 A | * | 2/1982 | Brown | 348/22 |
| 5,032,836 A | * | 7/1991 | Ono et al. | 340/825.71 |
| 5,146,153 A | * | 9/1992 | Luchaco et al. | 323/324 |
| 5,264,795 A | * | 11/1993 | Rider | 324/326 |
| 5,319,799 A | * | 6/1994 | Morita | 455/78 |
| 5,740,214 A | * | 4/1998 | Rebec et al. | 375/377 |

* cited by examiner

*Primary Examiner*—Jermele Hollington
(74) *Attorney, Agent, or Firm*—Rosenberg, Klein & Lee

(57) ABSTRACT

The present invention discloses a wireless remote control measuring multipurpose meter, which comprises a signal transmitter, a signal receiver, and a signal converter for converting a measured signal into a readable digital signal. The digital signal is transmitted to the signal receiver by a wireless transmission method and then the digital signal is displayed to improve the convenience for the practical utility of the product and enhance the safety of the measuring operation.

8 Claims, 5 Drawing Sheets

WIRELESS REMOTE CONTROL MEASURING MULTIPURPOSE METER

BACKGROUND OF THE INVENTION

1. Field of the Invention

This invention relates to a wireless remote control measuring multipurpose meter, more particularly to an improved meter extensively used in the applications of measuring a current (A), a voltage (V), a resistance (Ω), a capacitance (H), an inductance (L) . . . and etc. signals by a wireless transmission method and transmitting a digital signal to a signal receiver and displaying such digital signal.

2. Description of the Related Art

Please refer to FIG. 1 for a prior-art electric meter that measures a current, and the prior-art power circuit comprises a plurality of branch power switches distributed by a master power supply 10, and the total load of the master power supply 10 is the sum of the loads of a plurality of branch circuits 11, 12, 13, 14, 15, 16. The common traditional method for measuring a current is to use an measuring meter 2 to measure the current near the master power supply 10, in which the measuring meter 2 is also known as clamp meter or clamp-on meter comprising a current measuring clamp 21, a measuring terminal 22, a current/voltage transducer 23, a function and range selector 24, a display 25, a signal converter 26 and a select switch 27 as shown in FIG. 2. The current measured at the current measuring clamp 21 passes through the current/voltage transducer 23 and the signal is transmitted to the signal converter 26 and converted into a readable digital signal, and then the digital signal is sent to the display 25. The measured signal is displayed directly in numeric value. The principle and application of the foregoing prior-art measuring meter 2 are well known to those skilled in the art, and thus will not described in detail here.

In the foregoing measuring method, all branch power switches must be turned on one by one first, and then the power of each branch power switch is turned off to measure the current at each branch power switch. Alternatively, the power of all branch power switches are turned off first and then each branch power switch is turned on one by one to measure the current at each branch power switch. If the distance between the master power supply 10 and each branch power switch is too far, then it requires at least one person to stay near the master power supply 10 to observe and measure the current by the measuring meter 2, and another person to stay at a far end to turn on and off the branch power switches one by one. Such arrangement requires two or more people for the measuring operation and thus misunderstanding may occur in the communication between these people due to their long distance apart or cause them the trouble of climbing up and down to take the measurement at a high position. Further, when the branch power switches are measured one by one, those have not been measured yet are in an uncertain changeable status and thus causing errors to the measurement if someone turns on or off a certain electric appliance or equipment.

When someone uses a prior-art measuring meter 2 to measure a current (A) or a voltage (V) at a position very close to the measuring equipment, high risks exist in the measuring operation.

To overcome the existing shortcomings of the prior art and make the application more convenient and practical, the inventor of the present invention based on years of experience in the related industry to conduct extensive researches and experiments to maximize the utility of the multipurpose meter and finally invented the wireless remote control measuring multipurpose meter in accordance with the present invention.

SUMMARY OF THE INVENTION

The primary objective of this invention is to provide a wireless remote control measuring multipurpose meter that measures a signal, converts the measured signal into a readable digital signal by a signal converter, transmits the digital signal to a signal receiver by a wireless transmission method, and then displays the digital signal in order to improve the convenience of the practical utility of the product and enhance the safety of the measuring operation.

The present invention allows a user to switch the select switch to the desired function range such as a voltage (V), a resistance (Ω), a capacitance (H), an inductance (L) . . . and etc. according to the user's requirements, and the measuring result can be read by means of the digital signal measured at the measuring terminal via wireless transmission.

To make it easier for our examiner to understand the objective of the invention, its structure, innovative features, and performance, we use a preferred embodiment together with the attached drawings for the detailed description of the invention.

BRIEF DESCRIPTION OF THE DRAWINGS

Other features and advantages of the present invention will become apparent in the following detailed description of the preferred embodiments with reference to the accompanying drawings, in which.

DETAILED DESCRIPTION OF THE PREFERRED EMBODIMENTS

Figure 1:
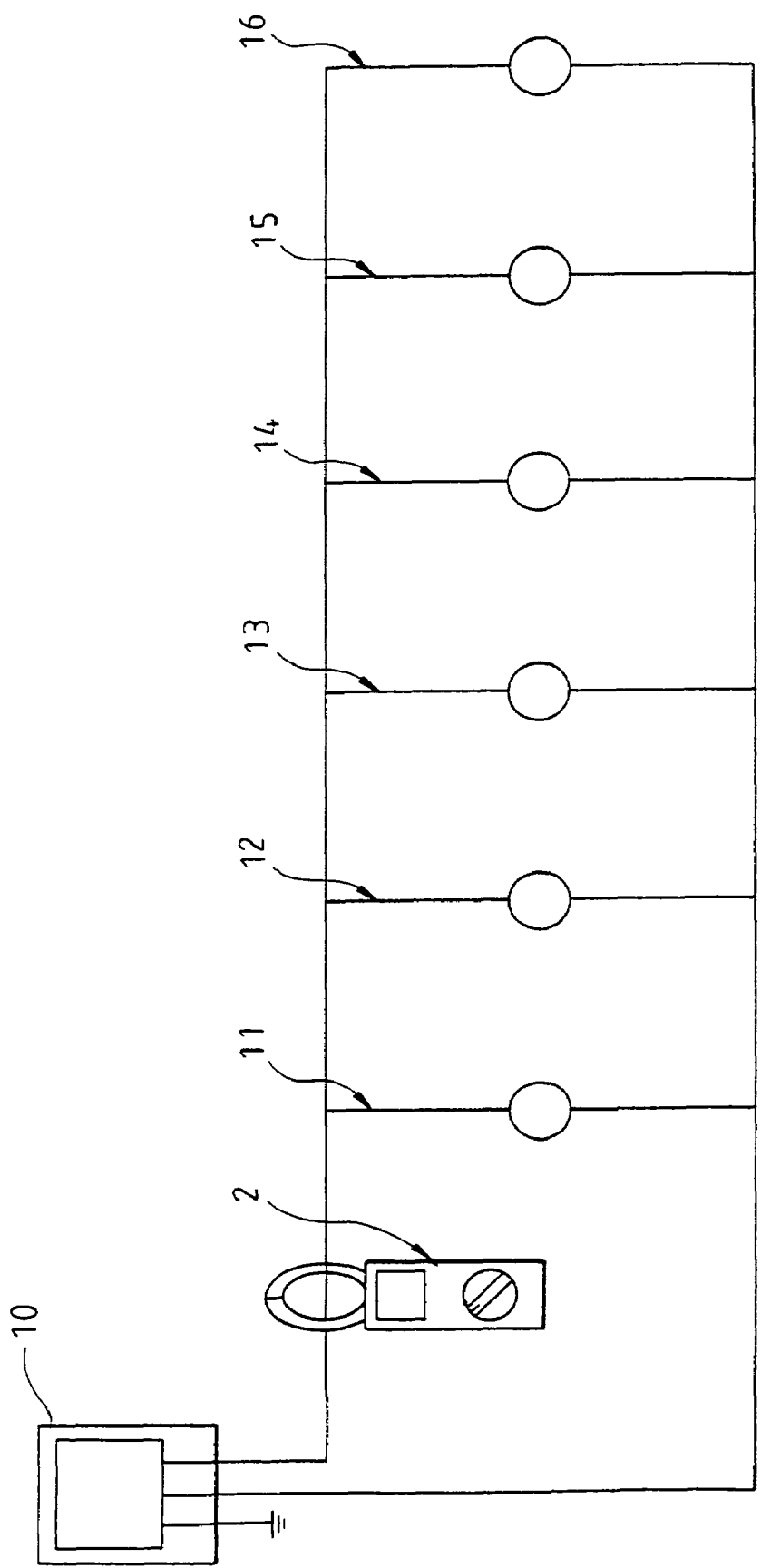
FIG. 1 is an illustrative view of a measuring status according to a prior art.
Figure 2:
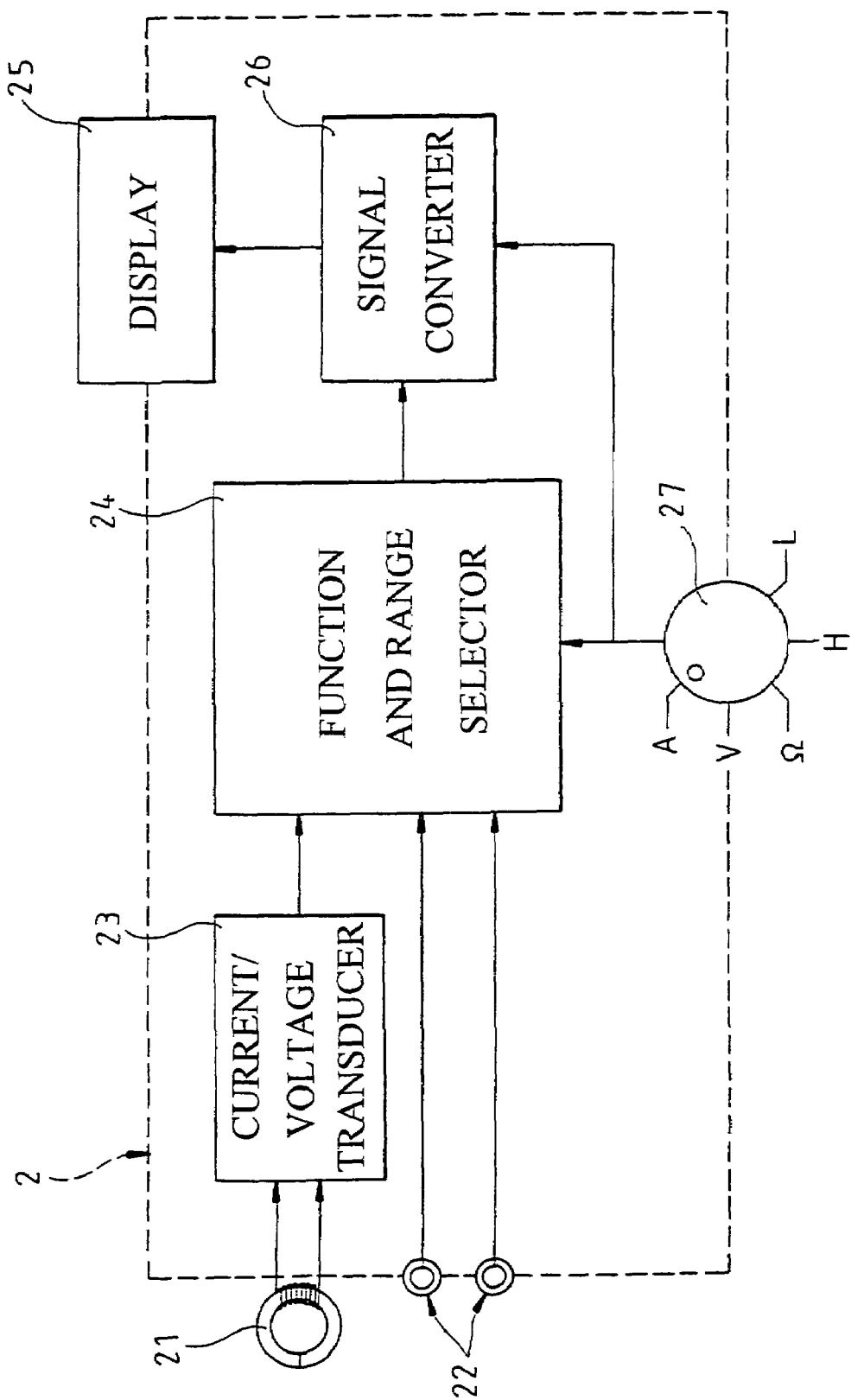
FIG. 2 is a block diagram of the structure of a prior-art measuring meter.
Figure 3:
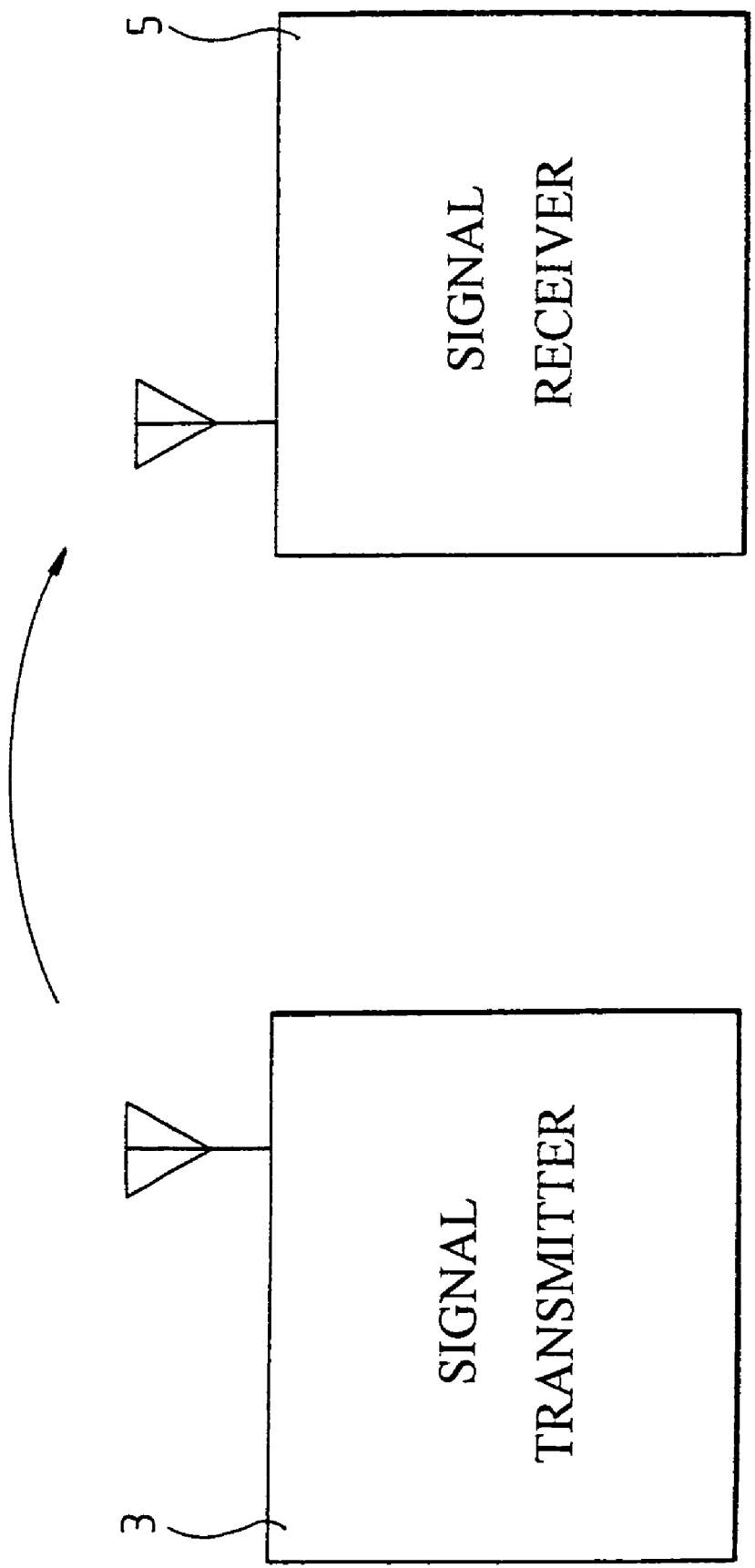
FIGS. 3~5 are block diagrams of the structure according to the present invention.
Figure 4:
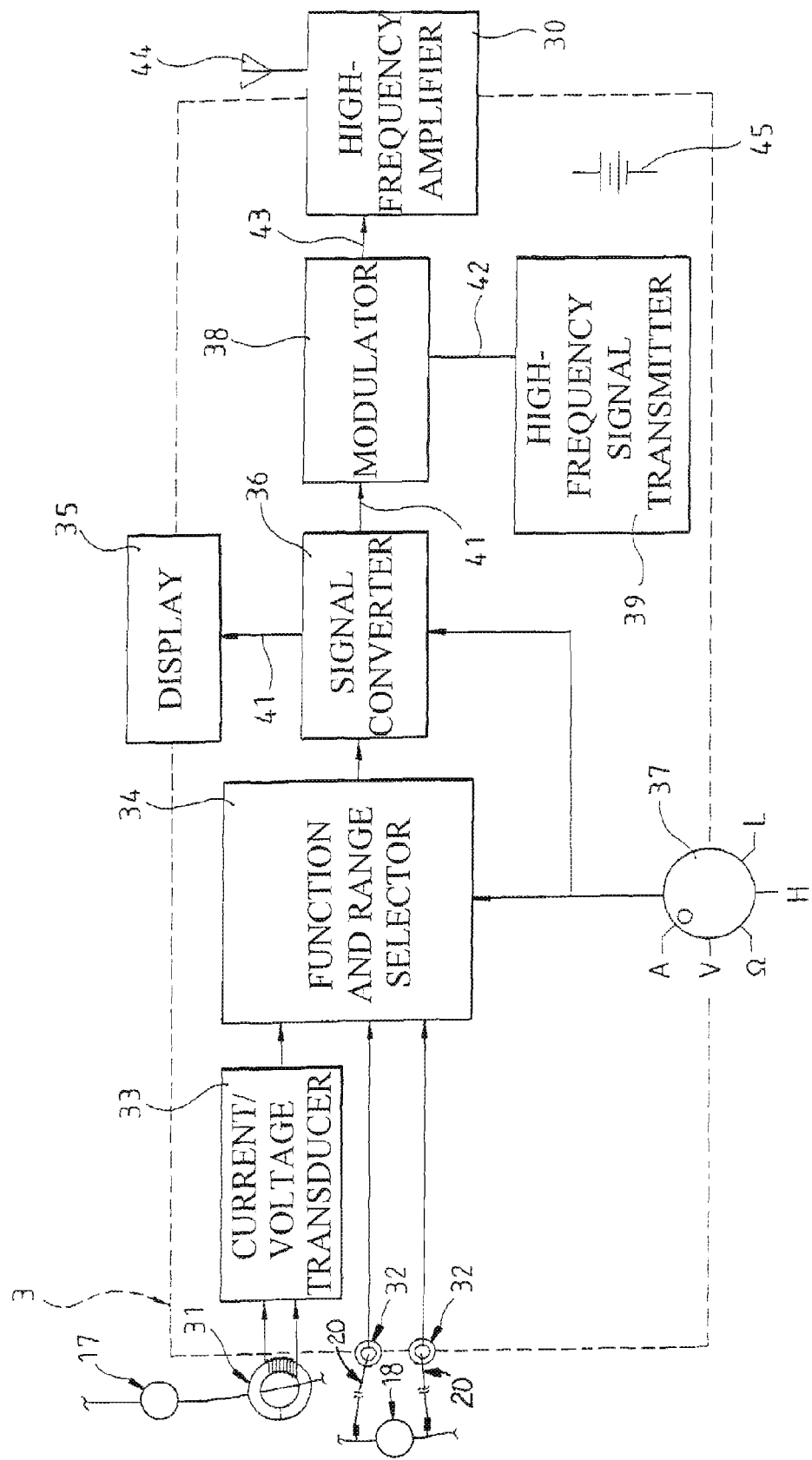

Please refer to FIG. 3 for a wireless remote control measuring multipurpose meter, which comprises a signal transmitter 3 and a signal receiver 5; wherein the signal transmitter 3 as shown in FIG. 4 comprises a current measuring clamp 31, a measuring terminal 32, a current/voltage transducer 33, a function and range selector 34, a display 35, a signal converter 36, a select switch 37, a modulator 38, a high-frequency signal transmitter 39, a high-frequency amplifier 30, a transmitter antenna 44 and a power supply 45. Users may adjust the select switch 37 to a desired function and range according to the user's requirements. Herein, the current (A) is measured as follows:

A current signal of a branch circuit 17 is measured by the current measuring clamp 31 and passes through the current/voltage transducer 33 and the function and range selector 34, and then the signal is sent to the signal converter 36 for converting the signal into a readable digital signal 41, and the digital signal 41 is sent to the display 35 while the measured digital signal 41 is sent to the modulator 38. A carrier wave 42 generated by a high-frequency signal transmitter 39 is moved to the modulator 38 and the digital signal 41 is modulated into a modulated signal 43. After the modulated signal 43 is amplified by the high-frequency amplifier 30, a radio signal is sent out from the transmitter antenna 44.

Figure 5:
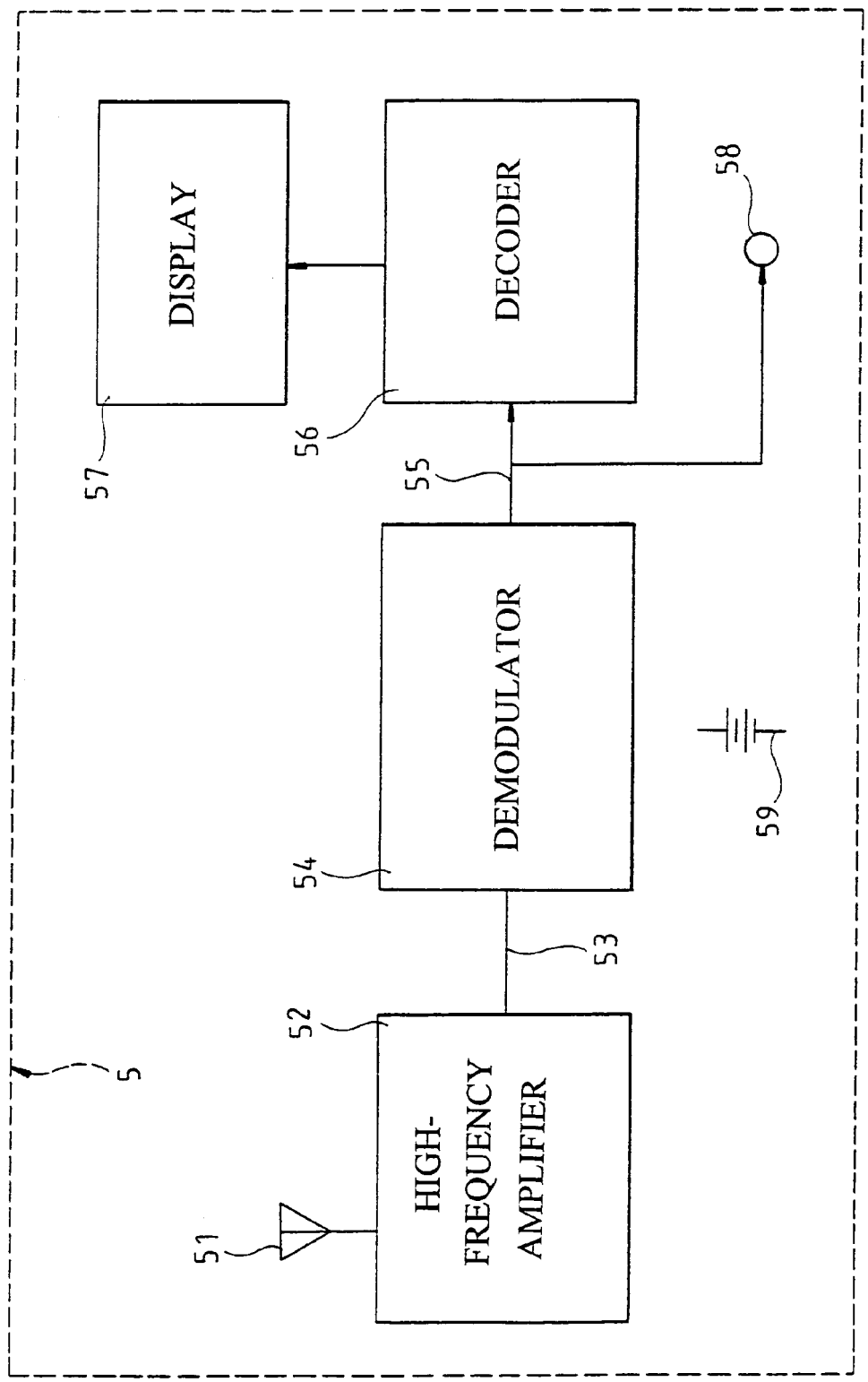

In FIG. 5, the signal receiver 5 comprises a receiver antenna 51, a high-frequency amplifier 52, a demodulator 54, a decoder 56, a display 57, a signal output terminal 58 and a power supply 59, wherein the aforementioned transmitted signal is received by the receiver antenna 51, and the received signal 53 is amplified by the high-frequency amplifier 52 and examined by the demodulator 54. Such examination provides a readable digital signal 55 from the modulated signal, and the demodulated digital signal 55 is saved into the decoder 56. The measured numeric value of the decoded signal is displayed on the display 57.

The present invention can output the digital signal 55 directly from the signal output terminal 58 to other related equipments for further application of the measured signals.

The signal measured by the signal transmitter 3 according to the present invention is converted into a readable digital signal by a signal converter, and then transmitted to the signal receiver 5 automatically or compulsorily in an instant via wireless transmission. The present invention adopts a long-distance wireless separated installation, so that the signal transmitter 3 is installed in advance at the position of the equipment that requires the measurement, and the operator can hold a signal receiver 5 at a far end to read the measuring result through the wireless transmission. Such arrangement definitely overcomes the shortcomings of the prior art that measures the testing equipments in a close distance and also requires two or more persons for the measuring operation. The present invention provides a more convenient practical utility and enhances the safety of the measuring operation.

The details described above focus on measuring a current (A) according to a preferred embodiment of the present invention. Users may adjust the select switch 37 to the desired measuring function and range for measuring signals such as a voltage (V), a resistance (Ω), a capacitance (H), an inductance (L) . . . and etc. signals according to the user's requirements. The measuring result of the signal from a branch circuit 18 is measured by the measuring terminal 32 and may be read via the wire 20 transmission.

In summation of the description above, the present invention definitely can meet the requirements of the original objectives and the invention herein enhances the performance than the conventional structure and further complies with the patent application requirements and is submitted to the Patent and Trademark Office for review and granting of the commensurate patent rights.

While the present invention has been described in connection with what is considered the most practical and preferred embodiment, it is understood that the invention is not limited to the disclosed embodiments but is intended to cover various arrangements included within the spirit and scope of the broadest interpretation and equivalent arrangements.

What is claimed is:

1. A wireless remote control measuring multipurpose meter comprising:
    a signal transmitter portion for selectively measuring each of multiple characteristic quantities of an object external thereto, said measuring transmitter portion including:
        a measuring unit producing a signal corresponding to a measured one of said multiple characteristic quantities, said measuring unit being selectively separated from or coupled to said external object; and
        a high-frequency signal transmitter coupled to said measuring unit, said high-frequency signal transmitter modulating said signal for transmission and transmitting said modulated signal; and
    a signal receiver portion physically removed from said signal transmitter portion and receiving said transmitted modulated signal, said receiver portion including:
        a demodulator demodulating said modulated signal to reproduce said signal; and
        a display for displaying a value corresponding to said measured one of said characteristic quantities as determined from said reproduced signal.

2. The wireless remote control measuring multipurpose meter as recited in claim 1, wherein said signal receiver portion includes an output terminal for providing said reproduced signal thereat.

3. The wireless remote control measuring multipurpose meter as recited in claim 1, wherein said signal transmitter portion includes a select switch for selecting a characteristic quantity from said multiple characteristic quantities.

4. The wireless remote control measuring multipurpose meter as recited in claim 3, wherein said multiple characteristic quantities include electrical current, electrical voltage, electrical resistance, electrical capacitance and electrical inductance.

5. A wireless remote control measuring multipurpose comprising:
    a measuring unit operable to measure a characteristic quantity of an external object and to produce a signal corresponding thereto, said measuring unit including a current measuring clamp for selectively coupling to said external object;
    a signal transmitter coupled to said measuring unit and operable to modulate said signal for transmission and further operable to transmit said modulated signal;
    a signal receiver physically removed from said measuring unit and operable to receive said transmitted modulated signal and further operable to demodulate said modulated signal to reproduce said signal; and
    a display coupled to said signal receiver for displaying a value corresponding to said characteristic quantity as determined from said reproduced signal.

6. A wireless remote control measuring multipurpose meter comprising:
    a measuring unit operable to measure a characteristic quantity of an external object and to produce a signal corresponding thereto, said measuring unit including a measuring terminal for detachably coupling measuring conductors selectively coupled to said external object;
    a signal transmitter coupled to said measuring unit and operable to modulate said signal for transmission and further operable to transmit said modulated signal;
    a signal receiver physically removed from said measuring unit and operable to receive said transmitted modulated signal and further operable to demodulate said modulated signal to reproduce said signal; and
    a display coupled to said signal receiver for displaying a value corresponding to said characteristic quantity as determined from said reproduced signal.

7. The wireless remote control measuring multipurpose meter as recited in claim 1, wherein said external object is an electrical circuit external to said signal transmitter portion.

8. The wireless remote control measuring multipurpose meter as recited in claim 1, wherein said signal transmitter portion includes a display operable to display said value corresponding to said measured one of said characteristic quantities.

* * * * *